United States Patent
Rha

(10) Patent No.: US 6,284,634 B1
(45) Date of Patent: Sep. 4, 2001

(54) METHOD FOR FORMING METAL LINE IN SEMICONDUCTOR DEVICE

(75) Inventor: Kyun Sa Rha, Seoul (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/323,227

(22) Filed: Jun. 1, 1999

(30) Foreign Application Priority Data

Feb. 22, 1999 (KR) .................................................. 99/5854

(51) Int. Cl.$^7$ ................................................ H01L 21/4763
(52) U.S. Cl. .......................... 438/592; 438/649; 438/655; 257/77; 257/750
(58) Field of Search ........................... 438/592, 653–656; 257/77, 750–754, 770, 412, 757

(56) References Cited

U.S. PATENT DOCUMENTS 5,318,924 * 6/1994 Lin et al. ........................... 438/649
5,719,410 * 2/1998 Suehiro et al. ..................... 257/77
5,907,188 * 5/1999 Nakajima et al. .................. 257/751

OTHER PUBLICATIONS

1997 IEEE Low–Resistivity Noble Integrated Clustered Electrode (NICE) WSix Polycide and its Application to a Deep Sub–Quarter Micron CMOS.

1997 IEEE A Comparison of TiN Processes for CVD W/TiN Gate Electrode on 3nm Gate Oxide.

* cited by examiner

Primary Examiner—David Nelms
Assistant Examiner—Dung A Le

(57) ABSTRACT

Method for forming a metal line in a semiconductor device, which can effectively suppress abnormal oxidation in formation of metal line of tungsten or tungsten silicide, including the steps of (1) forming an insulating material layer on a semiconductor substrate, and forming a conduction line on the insulating material layer, (2) nitriding an exposed surface of the conduction line, and (3) oxidizing the semiconductor substrate including the conduction line having a nitride layer formed on the exposed surface thereof.

18 Claims, 6 Drawing Sheets

* oxidation process(N₂/O₂ gas ambient)

METHOD FOR FORMING METAL LINE IN SEMICONDUCTOR DEVICE

BACKGROUND OF THE INVENTION

1. Field of the Invention

The present invention relates to a semiconductor device, and more particularly, to a method for forming a metal line in a semiconductor device, which can effectively suppress abnormal oxidation in formation of metal line of tungsten or tungsten silicide.

2. Background of the Related Art

Keeping pace with the trend of highly integrating semiconductor devices, drop of device operation speed has been resulting, not only in the case of metal line, but also in the cases of gate line and bit line. That is, a reduction of line width increases resistance, and the increased resistance causes RC delay time periods, to act as a main cause to deteriorate device performances, at the end. In order to solve the problem of increased resistivity, formation of the gate line or bit line of tungsten or tungsten silicide is suggested. That is, it is intended that a refractory metal silicide, such as tungsten silicide (WSix), titanium silicide (TiSi2), or cobalt silicide (CoSi2), is formed on the polysilicon layer for solving the problem of the increased resistivity of the metal line.

A related art process for forming a metal line in a semiconductor device will be explained with reference to the attached drawing. FIG. 1 illustrates a related art process for forming a metal line, and FIGS. 2a~2e illustrate sections showing the steps of a related art process for forming a metal line.

The related art process for forming a metal line of tungsten or tungsten silicide starts from defining a field region for isolating devices, injecting ions for forming well diffusion regions and threshold voltage adjustment, and patterning a gate line. In the gate line patterning, a gate oxide film is formed on a substrate, and polysilicon, tungsten (or tungsten silicide) and cap gate layers are stacked in succession on the oxide film and patterned. Upon finishing the gate line patterning, an oxidation process is conducted for compensating for etch damages in the gate line patterning and the loss of gate oxide film.

Referring to FIG. 2a, the related art process for forming a metal line in a semiconductor device starts from defining a field region on a semiconductor substrate 21, forming a well region, injecting ions for adjusting Vt (not shown), and forming a gate oxide film 22. Then, a material layer for forming a gate, such as a polysilicon layer 23, is formed on the gate oxide film 22. And, as shown in FIG. 2b, a tungsten layer (or a tungsten silicide layer) 24 is formed on the polysilicon layer 23. As shown in FIG. 2c, a cap gate layer 25 is formed on the tungsten layer 24. And, as shown in FIG. 2d, the stack of the cap gate layer 25, the tungsten layer 24, the polysilicon layer 23 and the gate oxide film 22 is selectively etched, to form a gate electrode 26. As shown in FIG. 2e, an oxidation process is conducted for compensating for stresses applied to the substrate during the patterning of the gate electrode 26.

The oxidation process is conducted in an $N_2/O_2$ ambient according to the following steps.

A wafer having passed through the gate line patterning process is loaded into a furnace or a RTP (Rapid Thermal Process) equipment, of which inside is at 500~700° C. in a nitrogen gas. Upon finishing loading of the wafer, inside temperature of the equipment is elevated to a range of 800~900° C. Annealing is conducted at 800~900° C. in a nitrogen ambient, and then an oxidation is conducted. In this instance, in the oxidation process, $N_2/O_2$ gas is introduced into the equipment while the 800~900° C. is maintained. Upon completion of the oxidation process, the temperature inside of the equipment is lowered to 500~700° C. and the $O_2$ gas is cut off. If the oxidation process proceeds without taking into account the phenomenon that the tungsten or tungsten silicide layer is liable to oxidize in the oxidation, the electrical characteristics of the gate line itself may be deteriorated. The easy oxidization of W in the W or WSIX layer during the oxidation process forms many protruded portions at the sides of the gate line, which deteriorate the electrical characteristics of the gate line as well as a withstand voltage of the gate oxide film. The abnormal oxidation of the W or WSix layer also occurs after patterning of bit line of W or WSix layer or metal line.

Accordingly, the aforementioned related art method for forming a metal line has the following problems.

When heat treatment is conducted using the furnace, abnormal oxidation occurs because the tungsten or tungsten silicide is liable to oxidize due to the oxygen entered during loading of the wafer or during elevation of an inside temperature of the furnace. Though the oxygen entering into the furnace may be purged by nitrogen gas during the temperature elevation, the abnormal oxidation of the tungsten or tungsten silicide layer still cannot be prevented because oxygen is used in the oxidation process. This abnormal oxidation of the tungsten or tungsten silicide layer also occurrs when heat treatment is conducted using RTP equipment, and deterioration of metal line characteristics can not be prevented. When such an abnormal oxidation occurs, many protruded portions form at the sides of the metal line, which deteriorates not only electrical characteristics of the metal line itself, but also a withstand voltage of a gate oxide film if the metal line is a gate line. This abnormal oxidation occurred is concentrated at ① part in FIG. 2e.

SUMMARY OF THE INVENTION

Accordingly, the present invention is directed to a method for forming a metal line in a semiconductor device that substantially obviates one or more of the problems due to limitations and disadvantages of the related art.

An object of the present invention is to provide a method for forming a metal line in a semiconductor device, which can effectively suppress abnormal oxidation in formation of a metal line of tungsten or tungsten silicide.

Additional features and advantages of the invention will be set forth in the description which follows, and in part will be apparent from the description, or by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming a metal line in a semiconductor device includes the steps of (1) forming an insulating material layer on a semiconductor substrate, and forming a conduction line on the insulating material layer, (2) nitriding an exposed surface of the conduction line, and (3) oxidizing the semiconductor substrate including the conduction line having a nitride layer formed on the exposed surface thereof, whereby effectively suppressing abnormal oxidation in formation of metal line of tungsten or tungsten silicide.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
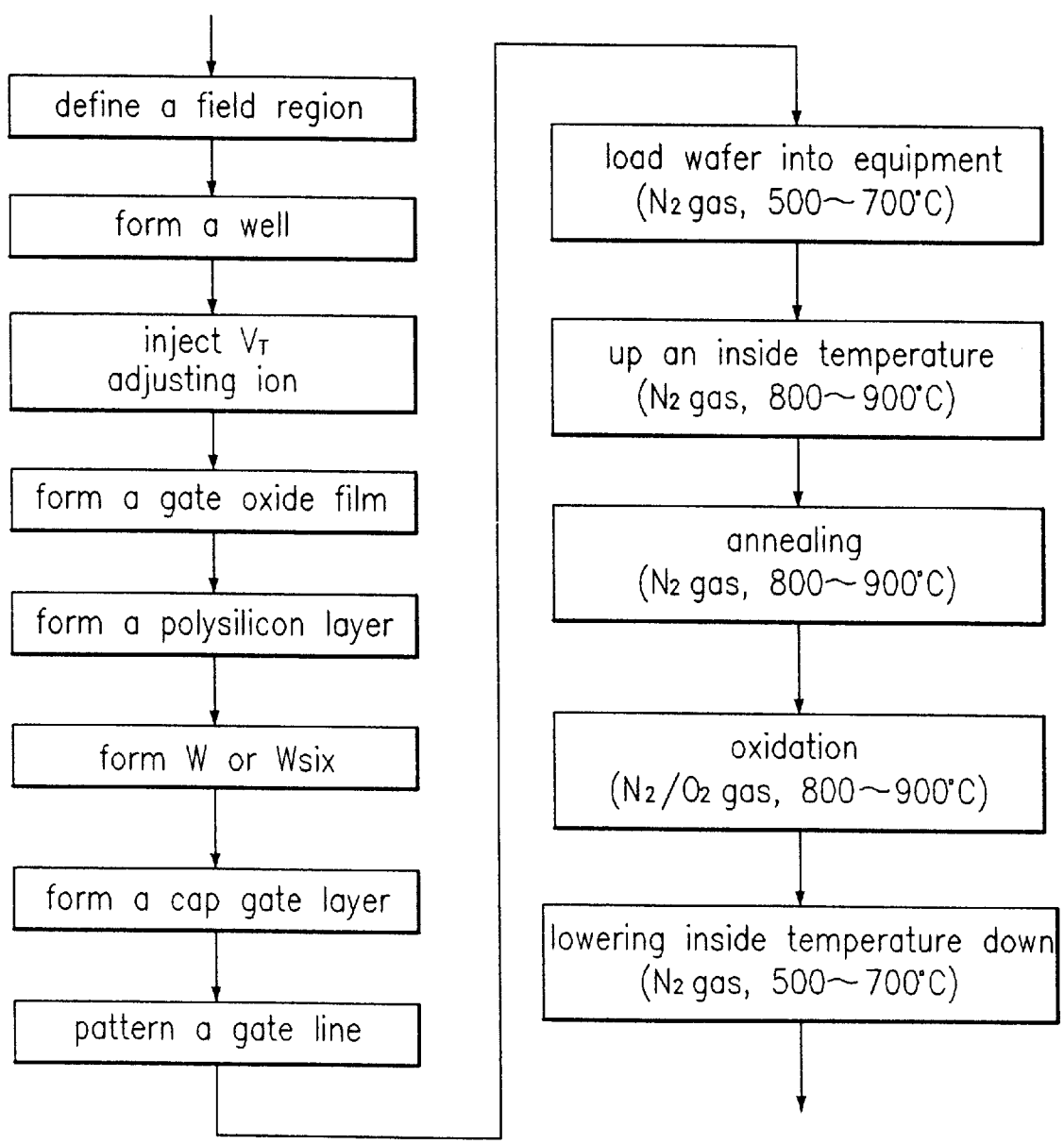
FIG. 1 illustrates a related art process for forming a metal line.
Figure 2A:
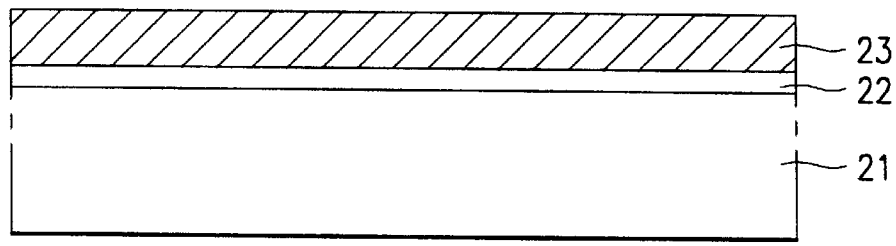
FIGS. 2a~2e illustrate sections showing the steps of a related art process for forming a metal line.
Figure 2B:
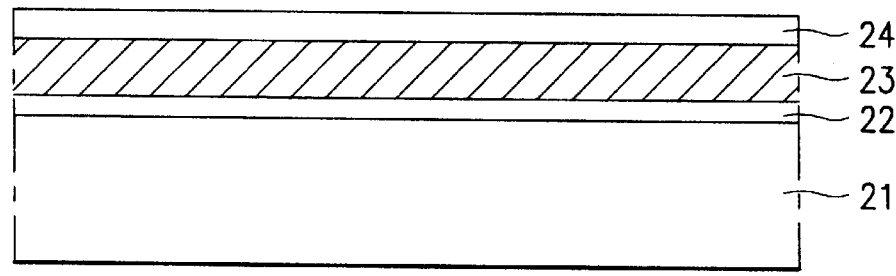
Figure 2C:
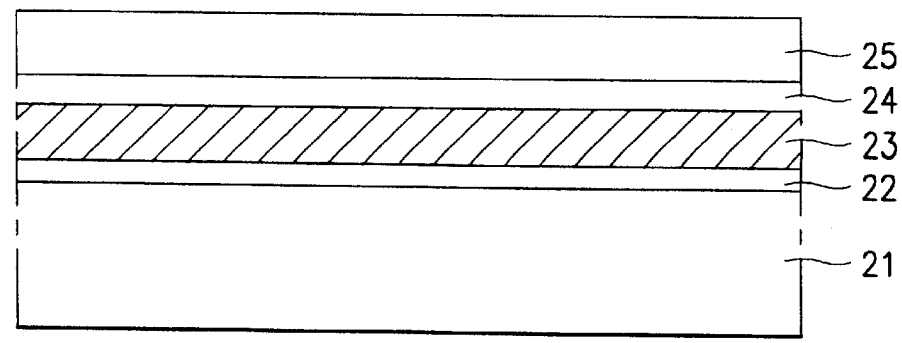
Figure 2D:
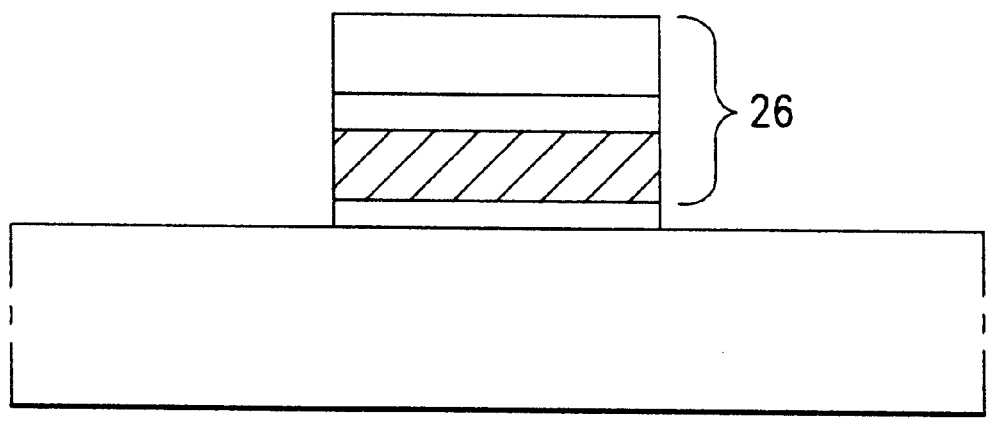
Figure 2E:
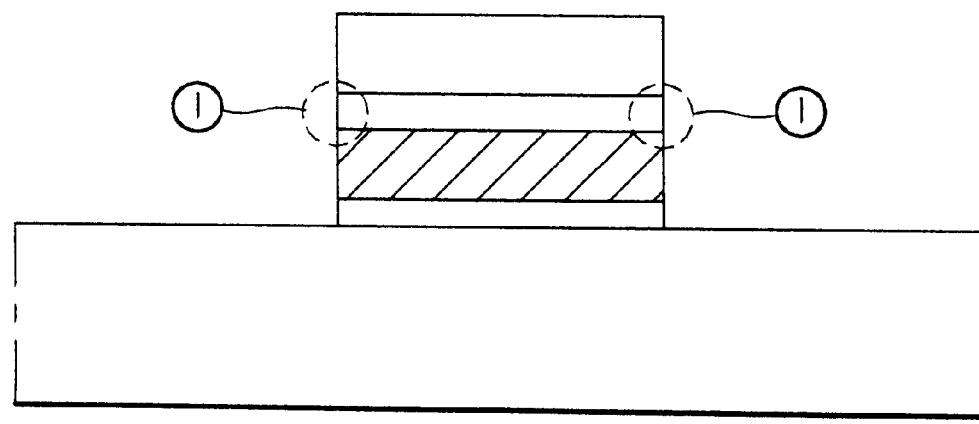
Figure 3:
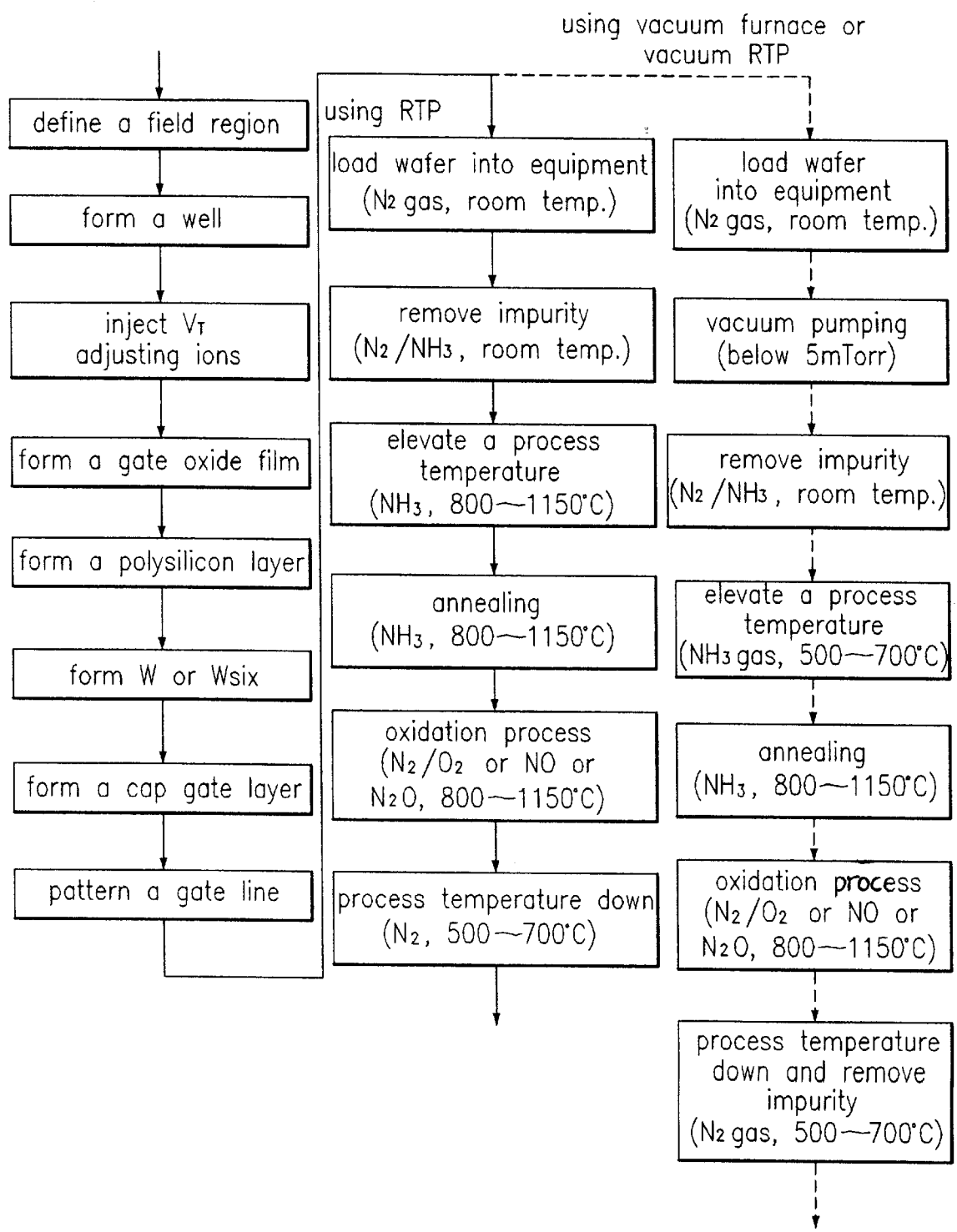
FIG. 3 illustrates a process for forming a metal line in accordance with a preferred embodiment of the present invention; and, FIGS. 4a~4f illustrate sections showing the steps of a process for forming a metal line in accordance with a preferred embodiment of the present invention.

Reference will now be made in detail to the preferred embodiments of the present invention, examples of which are illustrated in the accompanying drawings. FIG. 3 illustrates a process for forming a metal line in accordance with a preferred embodiment of the present invention, and FIGS. 4a~4f illustrate sections showing the steps of a process for forming a metal line in accordance with a preferred embodiment of the present invention. The present invention relates to a method for suppressing abnormal oxidation of a refractory metal or refractory metal silicide layer, such as a tungsten or tungsten silicide layer for use as a gate line, bit line, or metal line in a device equal to or over 256 DRAM class, and particularly, to a method for suppressing abnormal oxidation of W or WSix line by forming a tungsten nitride layer WN on an outer wall of the W or WSix line formed for use as a gate line, bit line, or metal line in a highly integrated device.

One embodiment of a method for forming a metal line of the present invention is proceeded according to the following process.

First, a field region for isolation of devices is defined, ion injections for forming a well diffusion region and for adjusting a threshold voltage are conducted, and patterning of a gate line is conducted. In the gate line patterning, a gate line oxide film is formed on a substrate as an insulating material layer, and polysilicon, tungsten (or tungsten silicide) and a cap gate layers are stacked on the gate oxide film in succession and subjected to patterning to form a conduction line. Upon completion of patterning of the conduction line, for example a gate line (or bit line, or a metal line), a tungsten nitride layer is formed on an exposed portion of a side of the patterned gate line, and an oxidation process is conducted for compensating for an etch damage and a loss of the gate oxide film caused by the gate line patterning.

Figure 4A:
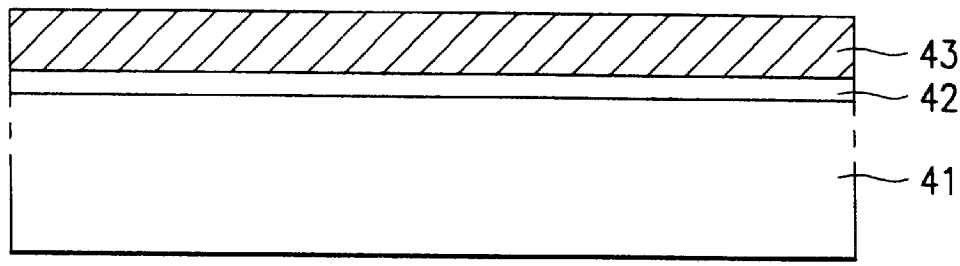
Figure 4B:
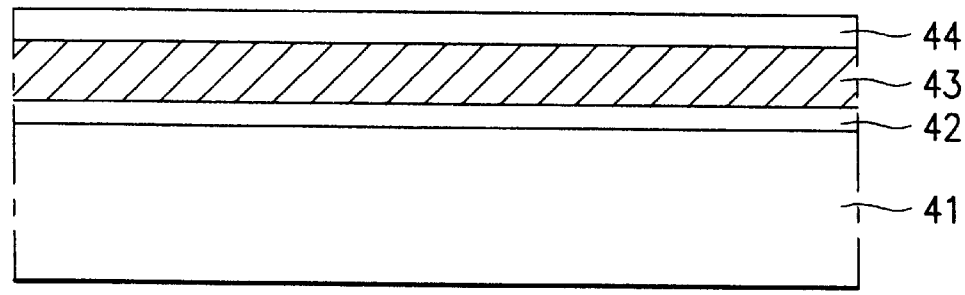
Figure 4C:
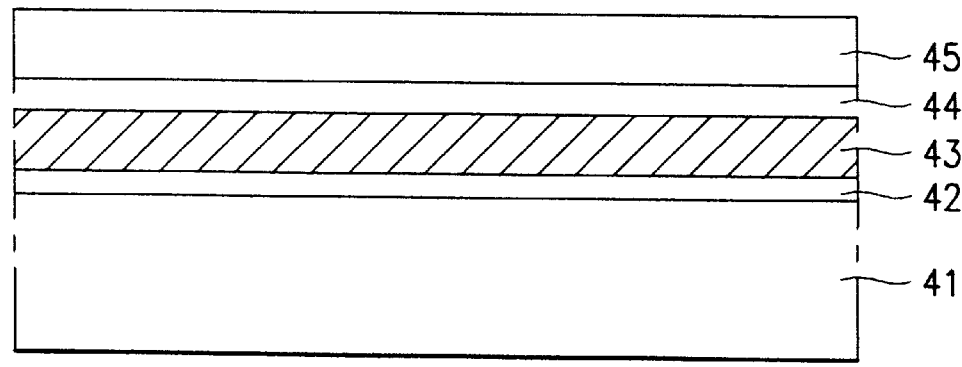
Figure 4D:
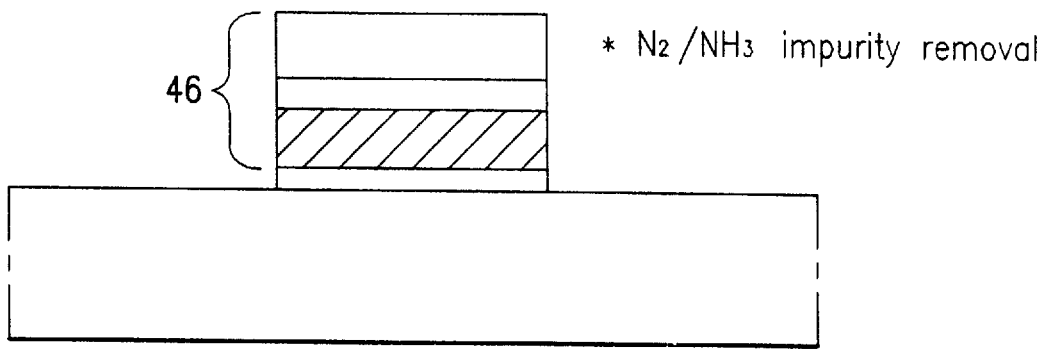

Referring to FIG. 4a, a process for forming a metal line in accordance with a preferred embodiment of the present invention starts with defining a field region on a semiconductor substrate 41, injecting ions (not shown) for forming a well region and adjusting Vt, and forming a gate oxide film 42. And, a material layer for forming a gate, for example, a polysilicon layer 43, is formed on the gate oxide film 42. As shown in FIG. 4b, a tungsten layer (or a tungsten silicide layer) 44 is formed on the polysilicon layer 43. Then, as shown in FIG. 4c, a cap gate layer 45 is formed on the tungsten layer 44. And, as shown in FIG. 4d, the stack of the cap gate layer 45, tungsten layer 42, polysilicon layer 43 and gate oxide film 44 is selectively etched, to form a gate electrode 46. Then, an oxidation process is conducted in a RTP equipment for relieving stress applied to the substrate.

Figure 4E:
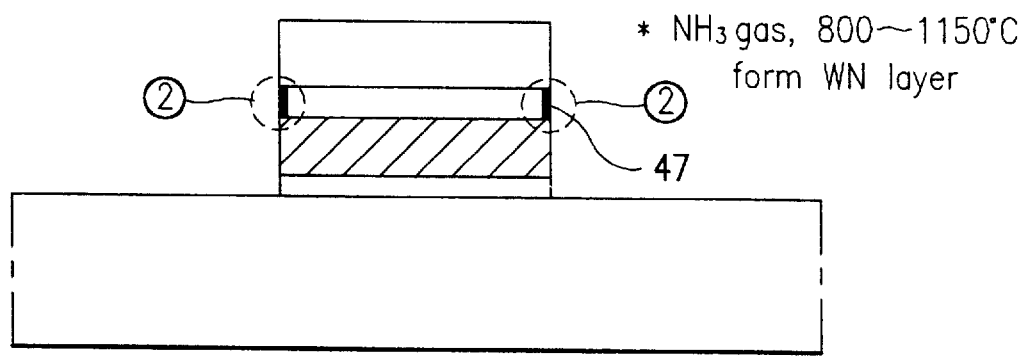
Figure 4F:
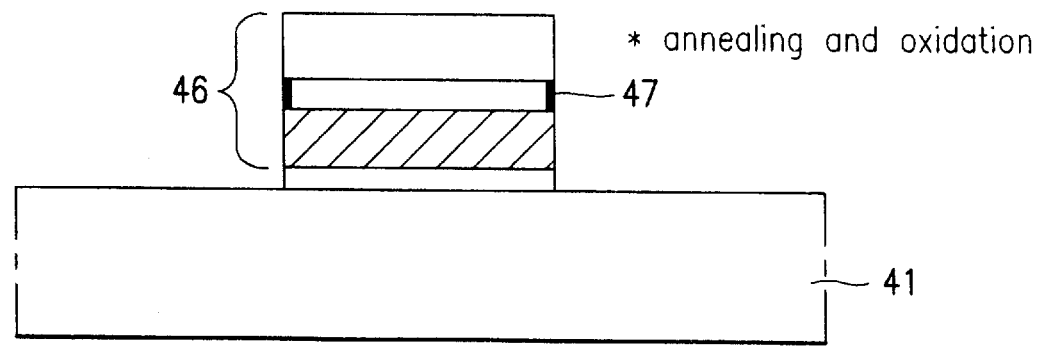

The oxidation process is conducted as follows. First, a wafer is loaded into the RTP equipment. In this instance. inside of the equipment is in a nitrogen ambient at a room temperature. Upon finishing of wafer loading, inside of the equipment is purged in an $N_2/NH_3$ ambient at a room temperature, to remove oxygen deposited on the wafer entrained during the loading of the wafer. And, as shown in FIG. 4e, annealing is conducted in an $NH_3$ ambient at an elevated temperature of inside of the equipment of 800~1500° C. In this annealing, $NH_3$ decomposes into nitrogen and hydrogen. Hydrogen removes tungsten oxide present on surfaces or grain boundaries of tungsten or tungsten silicide by reducing action. Nitrogen nitrifies the surface of the exposed tungsten or tungsten suicide to form a tungsten nitride (WN) layer 47. The tungsten nitride layer 47 is formed on a surface portion (②‘ portion in FIG. 4e) of the exposed tungsten or tungsten silicide layer 44 at which the abnormal oxidation mostly occurs. In this instance, if the patterned line is a gate line. the line has a stack of a polysilicon layer, a tungsten layer or a polysilicon layer and a tungsten silicide layer. and if a bit line, the line has a stack of a polysilicon layer and a tungsten silicide layer, or a single layer of tungsten. Then, as shown in FIG. 4f, an oxidation process is conducted while $N_2/O_2$ gas or NO or $N_2O$ gas is introduced into the equipment and the temperature inside of the equipment is maintained at 800~1150° C. Upon completion of the oxidation process, the temperature inside of the equipment is lowered down to 500~700° C., and the nitrogen gas ambient is maintained.

If a vacuum furnace or vacuum RTP equipment is used instead of the RTP equipment, the oxidation process is conducted as follows.

Referring to FIG. 4d, upon finishing the patterning of the gate electrode 46 by selectively etching the stack of the cap gate layer 45, the tungsten layer 44, the polysilicon layer 43 and the gate oxide film 44 is selectively etched, the wafer is loaded into the vacuum furnace or the vacuum RTP equipment, which is in a nitrogen ambient at a room temperature. Upon finishing loading of the wafer, the equipment is evacuated for the first time, to remove oxygen deposited on the wafer during the loading. Then equipment is purged in an $N_2/NH_3$ ambient at a room temperature, to remove the oxygen deposited on the wafer during the loading for the second time. Then, an annealing is conducted in an $NH_3$ ambient at an elevated temperature of 800~1150° C. inside of the equipment. In this instance. the annealing decomposes $NH_3$ into nitrogen and hydrogen. The hydrogen removes tungsten oxide present on surfaces or within grain boundaries of the tungsten or tungsten silicide by reducing action and the nitrogen nitrifies the exposed surface of the tungsten or tungsten silicide, to form a tungsten nitride layer 47. The tungsten nitride layer 47 is formed on a surface of the exposed tungsten or tungsten silicide layer 44 at which the abnormal oxidation is occurred mostly. The tungsten silicide layer 44 formed thus acts as an oxidation prevention film in a following oxidation process. Then, an oxidation process is conducted, introducing $N_2/O_2$ gas or NO or $N_2O$ gas into the equipment and maintaining the temperature inside of the equipment at 800~1150° C. Upon completion of the oxidation process, the temperature inside of the equipment is lowered down to 500~700° C. and the equipment is purged using nitrogen gas, to remove impurity.

Thus, in the method for forming a metal line in a semiconductor device of the present invention, oxygen present in air during loading of a wafer is removed by purging or vacuum pumping, and $NH_3$ gas is used in a temperature elevation or annealing. Hydrogen removes tungsten oxide present on surfaces or within grain boundaries of the tungsten or tungsten silicide by reducing action, and nitrogen nitrifies the exposed surface of the tungsten or tungsten silicide, to form a tungsten nitride layer.

The method for forming a metal line in a semiconductor device of the present invention has the following advantages.

The electrical characteristics of a metal line are improved by inhibiting abnormal oxidation by performing a wafer oxidation process after patterning a metal line and forming a tungsten nitride layer on exposed portions of a tungsten or tungsten suicide layer.

The electrical characteristics of a metal line are improved by inhibiting abnormal oxidation by performing a wafer oxidation process after patterning a metal line and forming a tungsten nitride layer on exposed portions of a tungsten or tungsten silicide layer. The use of a tungsten layer or tungsten nitride layer as a gate line of which abnormal oxidation is inhibited improves a withstand voltage of a gate oxide film.

It will be apparent to those skilled in the art that various modifications and variations can be made in the method for forming a metal line in a semiconductor device of the present invention without departing from the spirit or scope of the invention. Thus, it is intended that the present invention cover the modifications and variations of this invention provided they come within the scope of the appended claims and their equivalents.

What is claimed is:

1. A method for forming a metal line in a semiconductor device, comprising:

forming an insulating material layer on a semiconductor substrate and;

forming a conduction line on the insulating material layer;

forming a nitride layer on only a portion of at least one exposed surface of the conduction line by nitriding the at least one exposed surface; and, oxidizing the semiconductor substrate including the conduction line having the nitride layer formed on the portion of at least one exposed surface.

2. The method in claim 1, wherein the conduction line includes a stack of a polysilicon layer and a refractory metal layer.

3. The method in claim 1, wherein the conduction line includes a stack of a polysilicon layer and a refractory metal silicide layer.

4. The method in claim 1, wherein the conduction line includes a single layer of a refractory metal layer only.

5. The method in claim 1, wherein the conduction line includes a tungsten or a tungsten silicide layer stacked on a polysilicon layer.

6. The method in claim 1, wherein the forming a nitride layer step is conducted using $NH_3$ gas.

7. The method in claim 6, wherein the forming a nitride layer step includes conducting annealing to decompose the $NH_3$ gas into nitrogen and hydrogen, so that the decomposed hydrogen removes oxide present on surfaces or within grain boundaries of the conduction line by reducing action.

8. The method in claim 1, wherein the forming a nitride layer and oxidizing steps are conducted in a rapid thermal processor (RTP) or vacuum RTP or vacuum furnace.

9. The method as defined in claim 1, wherein said conduction line includes:

a cap gate layer;

a metal layer;

the cap gate layer on the metal layer and the metal layer on the insulating material such that only the sides of the metal layer are exposed surfaces; and said forming a nitride layer step forms a nitride layer on only the exposed surfaces of the metal layer.

10. The method of claim 1, wherein the exposed surfaces of the conduction line include only the side surfaces of the conduction line.

11. The method of claim 1, wherein the conduction line includes a metal layer having exposed side surfaces, and said nitride layer is formed on only the exposed side surfaces of the metal layer.

12. The method of claim 1, wherein the oxidizing includes:

placing the semiconductor device into a chamber;

introducing $N_2/O_2$ gas or NO or $N_2O$ gas into the chamber; and maintaining the temperature inside the equipment at 800~1150° C.

13. A method for forming a metal line in a semiconductor device, comprising:

forming a gate oxide film on a semiconductor substrate;

forming a polysilicon layer on the gate oxide film;

forming a tungsten layer on the polysilicon layer;

forming a cap gate layer on the tungsten layer;

forming a patterned gate line by selectively patterning a stack of the cap gate layer, the tungsten layer, the polysilicon layer and the gate oxide film;

nitriding the patterned gate line to form tungsten nitride layers at sides of the tungsten layer of the patterned gate line; and oxidizing the semiconductor device including the patterned gate line using the tungsten nitride layers as oxidation prevention films.

14. A method as claimed in claim 13, wherein the gate line includes a stack of polysilicon layer and a tungsten silicide layer.

15. A method as claimed in claim 13, wherein said nitriding and oxidizing steps collectively comprise:

loading the semiconductor substrate into a rapid thermal process (RTP) equipment, purging the RTP equipment in an $N_2/NH_3$ ambient at a room temperature upon completion of loading, for removing oxygen deposited on a semiconductor substrate during the loading, conducting annealing in an $NH_3$ ambient at 800~1150° C., for removing oxide present on a surface or in grain boundaries of the tungsten layer and forming a tungsten nitride layer on an exposed surface of the tungsten layer, conducting an oxidation process using the tungsten nitride layer as an oxidation prevention film, lowering the temperature to 500~700° C., and maintaining a nitrogen gas ambient upon completion of the oxidation.

16. The method in claim 13, wherein said oxidizing step includes:
- placing said semiconductor device into a chamber;
- introducing $N_2/O_2$ gas or NO or $N_2O$ gas into the chamber; and
- maintaining the temperature inside of the chamber at 800~1150° C.

17. The method in claim 13, wherein said nitriding and oxidizing steps include:
- loading the semiconductor device into a vacuum furnace or a vacuum rapid thermal process (RTP) equipment,
- evacuating the vacuum furnace or the vacuum RTP equipment upon completion of loading, for removing oxygen deposited on a wafer during the loading for the first time,
- purging the vacuum furnace or the vacuum RTP equipment in an $N_2/NH_3$ ambient at a room temperature, for removing the oxygen remained on the wafer during the loading for the second time,
- conducting annealing in an $NH_3$ ambient at 800~1150° C., for removing oxide present on a surface or in grain boundaries of the tungsten layer and forming a tungsten nitride layer on an exposed surface of the tungsten layer,
- conducting an oxidation process using the tungsten nitride layer as an oxidation prevention film,
- lowering the temperature to 500~700° C., and
- maintaining a nitrogen gas ambient upon completion of the oxidation.

18. A method as claimed in claim 13, wherein said oxidizing step includes:
- introducing $N_2/O_2$ gas or NO or $N_2O$ gas into a vacuum furnace or vacuum rapid thermal process (RTP) equipment; and
- maintaining the temperature inside of the furnace or equipment at 800~1150° C.

* * * * *